(12) United States Patent
Heidel et al.

(10) Patent No.: US 7,439,724 B2
(45) Date of Patent: Oct. 21, 2008

(54) ON-CHIP JITTER MEASUREMENT CIRCUIT

(75) Inventors: David F. Heidel, Mahopac, NY (US);
Keith A. Jenkins, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 1341 days.

(21) Appl. No.: 10/638,825

(22) Filed: Aug. 11, 2003

(65) Prior Publication Data
US 2005/0036578 A1    Feb. 17, 2005

(51) Int. Cl.
*G01R 23/00* (2006.01)
*H04L 7/00* (2006.01)
*H03L 7/06* (2006.01)

(52) U.S. Cl. ............... 324/76.82; 324/76.55; 375/371; 331/1 A

(58) Field of Classification Search ............... 324/76.82, 324/76.53, 76.54, 76.55; 375/371; 331/1 A
See application file for complete search history.

(56) References Cited

U.S. PATENT DOCUMENTS

| | | | | |
|---|---|---|---|---|
| 5,889,435 A | * | 3/1999 | Smith et al. | 331/1 A |
| 2003/0223526 A1 | * | 12/2003 | Sorna | 375/376 |
| 2005/0024037 A1 | * | 2/2005 | Fetzer | 324/76.53 |

* cited by examiner

*Primary Examiner*—Vincent Q Nguyen
(74) *Attorney, Agent, or Firm*—F. Chau & Associates, LLC

(57) ABSTRACT

An on-chip jitter measurement circuit and corresponding method are provided for receiving a reference clock and a signal of interest, including a latch for comparing the arrival time of the signal of interest to the reference clock, a delay chain in signal communication with the reference clock for varying the arrival time of the reference clock, the delay chain having a first stage, a middle stage, and a last stage, a voltage controller in signal communication with the middle stage of the delay chain for controlling the delay of the arrival time of the reference clock while permitting the first and last stages of the delay chain to retain a full voltage swing independent of the delay.

1 Claim, 2 Drawing Sheets

ON-CHIP JITTER MEASUREMENT CIRCUIT

BACKGROUND

The present disclosure relates to integrated circuits and, more particularly, to an apparatus and method for measuring the jitter of an integrated circuit.

Conventionally, jitter is measured by bringing the signals to be measured off of the chip. On-chip methods have been proposed, but generally suffered from calibration delays, extended measurement times and/or the presence of noise sources during measurement.

Accordingly, what is needed is a new on-chip jitter measurement circuit to enable measurement of jitter at multiple internal nodes without the need to bring the signals to be measured off the chip. It is desirable that the new on-chip jitter measurement circuit be self-calibrating, and compare favorably to other proposed methods in terms of smaller size, reduced measurement time, and elimination of noise sources during measurement.

SUMMARY

These and other drawbacks and disadvantages of the prior art are addressed by an on-chip jitter measurement circuit in accordance with embodiments of the present disclosure.

An on-chip jitter measurement circuit and corresponding method are provided for receiving a reference clock and a signal of interest, including a latch for comparing the arrival time of the signal of interest to the reference clock, a delay chain in signal communication with the reference clock for varying the arrival time of the reference clock, the delay chain having a first stage, a middle stage, and a last stage, a voltage controller in signal communication with the middle stage of the delay chain for controlling the delay of the arrival time of the reference clock while permitting the first and last stages of the delay chain to retain a full voltage swing independent of the delay.

These and other aspects, features and advantages of the present disclosure will become apparent from the following description of exemplary embodiments, which is to be read in connection with the accompanying drawings.

BRIEF DESCRIPTION OF THE DRAWINGS

The present disclosure provides an on-chip jitter measurement circuit in accordance with the following exemplary figures, in which.

DETAILED DESCRIPTION OF PREFERRED EMBODIMENTS

Embodiments of the presently disclosed apparatus and method provide a new on-chip jitter measurement circuit that enables measurement of jitter at multiple internal nodes without the need to bring the signals to be measured off of the chip. The new circuit is self-calibrating, and provides an effective and accurate method for jitter measurements. Relative to other proposed methods, the new circuit is smaller, reduces measurement time, and eliminates noise sources during the measurement of jitter.

Figure 1:
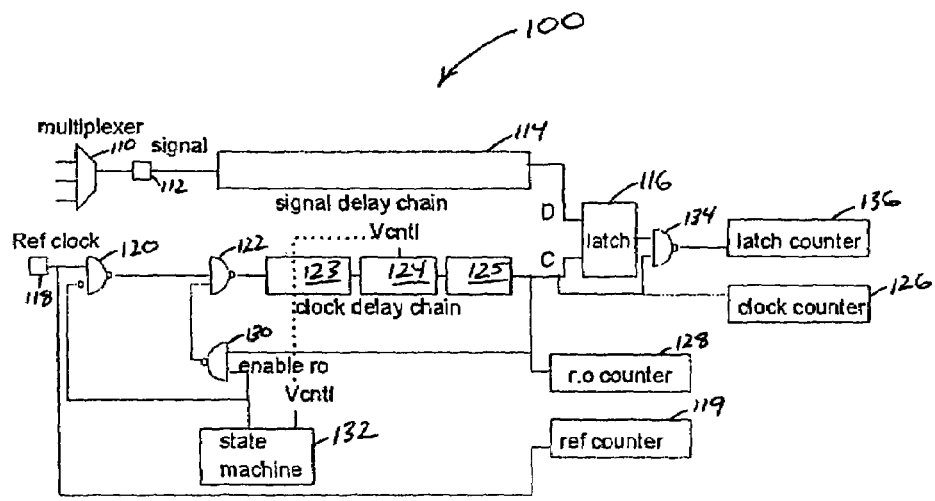
FIG. 1 shows a schematic diagram of an on-chip jitter measurement circuit in accordance with an exemplary embodiment of the present disclosure.

As shown in FIG. 1, an on-chip jitter measurement circuit is indicated generally by the reference numeral 100. The circuit 100 includes a multiplexer 110 in signal communication with an optional signal pad 112. The signal pad 112 is in signal communication with a signal delay chain 114, which is coupled to the data or D-input of an edge-triggered latch 116. A reference clock pad 118 is in signal communication with each of a reference counter 119 and a non-inverting input of a first NAND gate 120, the output of which is in signal communication with a non-inverting input of a second NAND gate 122. The output of the second NAND gate 122 is in signal communication with a clock delay chain 124, having first and last delay stages 123 and 125, respectively.

The output of the clock delay chain 124 is in signal communication with the clock or C-input of the latch 116. The output of the clock delay chain 124 is further in signal communication with each of a clock counter 126, a ring oscillator counter 128, and a non-inverting input of a third NAND gate 130. A state machine 132 provides a voltage control signal Vcntl to the clock delay chain 124, except that this control signal is not provided to the first and last delay stages 123 and 125, respectively. The state machine 132 is in signal communication with each of a second non-inverting input of the NAND gate 130, and an inverting input of the NAND gate 120.

The output of the latch 116 is in signal communication with a non-inverting input of a fourth NAND gate 134. The clock delay chain 124 is in signal communication with a second non-inverting input of the fourth NAND gate 134. The output of the fourth NAND gate 134 is in signal communication with a latch counter 136.

In operation of the circuit 100 of FIG. 1, the signal to be measured, such as the clock of a microprocessor, is delayed by a chain 114 of inverters or differential buffers. A reference clock is delayed at the clock delay chain 124 by a similar amount of time. The circuit measures the jitter of the signal with respect to the reference, which may be, for example, an off-chip clock generator from which the internal signal is derived by a PLL. The delayed signal is compared to the reference clock by the latch 116. If the signal precedes the reference, a "1" is latched. The latch output is compared with the reference clock on every cycle. Any given clock pulse, either a "0" or a "1", may be latched. Over a large number of clocks, the average value of the latch is determined by the timing jitter of the signal, as described below.

The NAND gate 134 formed by the latch and the clock effectively resets the latch output after every clock cycle. The latching process is repeated many times and every "1" increments the counter 136. The variation of the timing of the signal with respect to the reference results in some signals failing to register a "1". The rate of "1"s is determined by the jitter of the signal and the timing of the reference clock.

Figure 2:
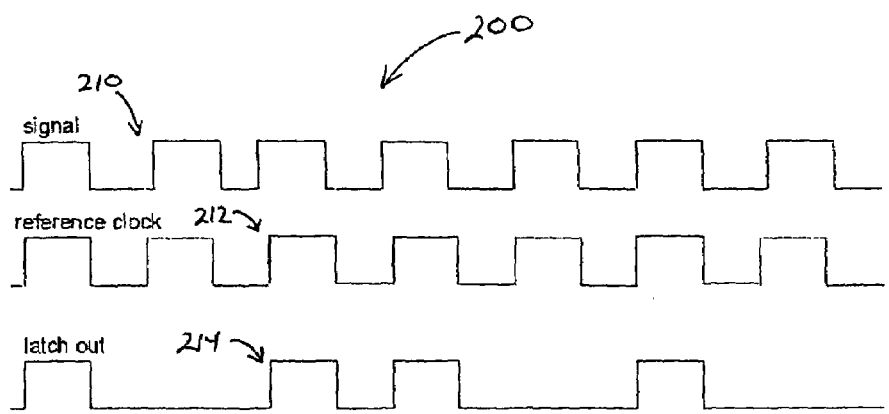
FIG. 2 shows an exemplary timing diagram for jitter measurement in accordance with FIG. 1.

Turning to FIG. 2, a comparison of the rate of "1"s as determined by the jitter of the signal and the timing of the reference clock is indicated generally by the reference numeral 200. Here, there are seven pulses of the signal 210, seven pulses of the reference clock 212, but only four of the seven signals register as "1"s in the latch output signal 214. The ratio of latched signals to reference signals is the required measurement quantity, which is formed from counts in the latch counter 136 and the clock counter 126 of FIG. 1.

The timing of the reference clock arriving at the latch input is varied by control of the clock delay chain. Thus, for some values of this delay, all of the signals will register a "1"; while for other values, all of the signals will register a "0". By varying this delay, the cumulative distribution of timing of the signal will be generated.

Figure 3:
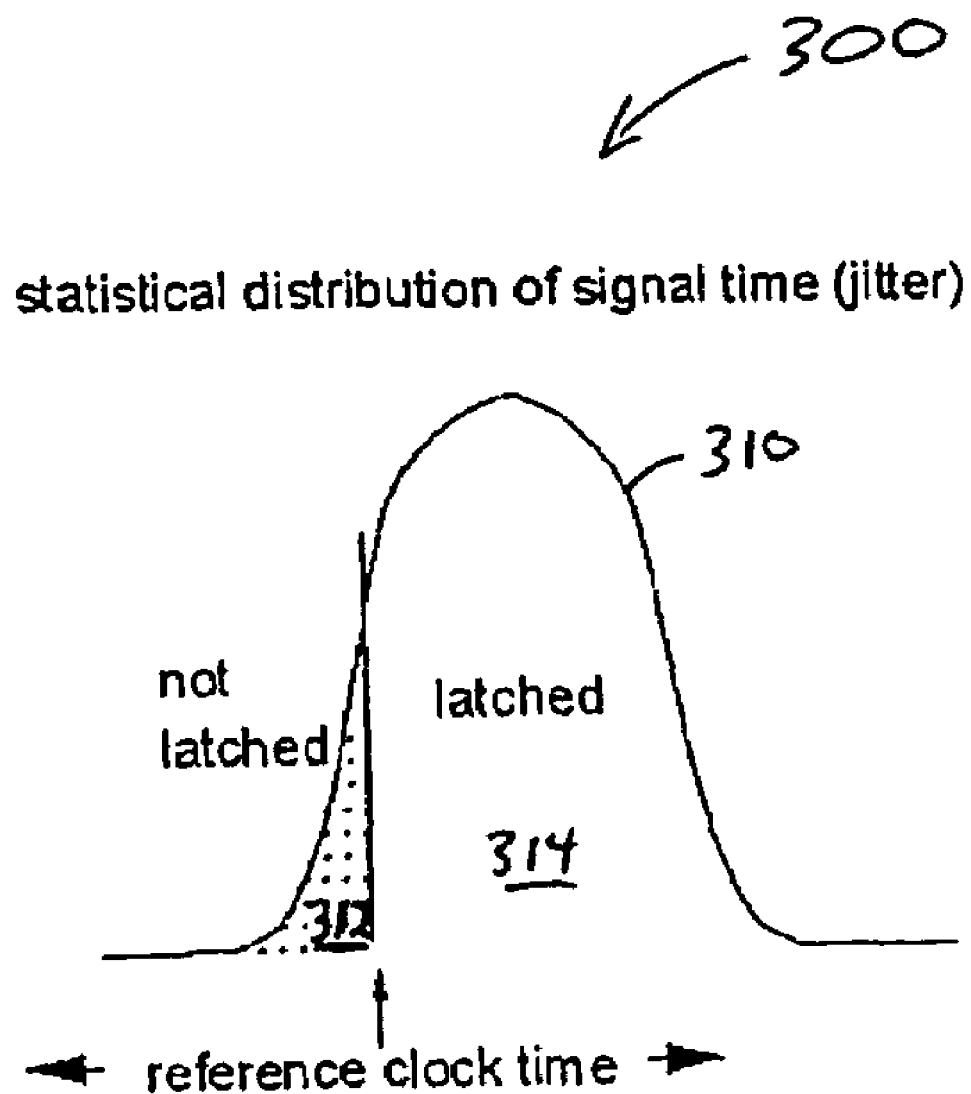
FIG. 3 shows an exemplary statistical plot of measured jitter in accordance with FIG. 1.

Turning now to FIG. 3, a statistical distribution of signal time ("jitter") is indicated generally by the reference numeral 300, where the jitter 310 is shown. As indicated for the "not latched" region 312 and the "latched" region 314, all signals that precede the reference clock will be counted by the latch counter 136 of FIG. 1, and the spectrum is integrated by moving the reference clock time through the signal distribution, resulting in a cumulative distribution function ("CDF"). The original spectrum is recovered by differentiating the CDF.

The clock delay that triggers the latch is controlled by a voltage generated by an on-chip state machine 132. The delay range is varied to span the maximum jitter. The dependence of the delay on the control voltage is calibrated by configuring the delay chain as a ring oscillator by blocking the reference clock and enabling the loop NAND gate 130. The frequency of the ring oscillator is measured as a function of the delay control voltage, and as the frequency is inversely proportional to the delay of the clock delay chain 124, the variation of frequency provides a calibration of the delay. The frequency is measured on-chip by counting the pulses of the ring oscillator ("r.o.") with the r.o. counter 128, and comparing that count to a count of reference clock signals measured by the reference counter 119 during a fixed measurement interval. The result can be stored in the state machine 132 or sent off chip in digital form.

The signal and reference clock are running continuously before and during the measurement process, so there is no power supply noise caused by initiating the measurement process, which might otherwise lead to delay inaccuracies. The first 123 and last stages 125 of the delay signal do not have a control voltage applied, so they retain the full voltage swing independent of the delay required. Every clock cycle can be measured, subject to the limits of the latch, so that the total measurement time is very small, typically less than 1 msec.

By using the multiplexer 110, numerous on-chip signals can be measured with the jitter measurement circuit. Fixed delays can also be added to the variable delays, if necessary, to account for a phase difference between the input signal and the reference signal.

Embodiments of the present disclosure described herein provide advantageous features over prior proposals, including: 1) the delay generator runs continuously, avoiding power supply noise caused by gating; 2) every clock cycle is used for measurement, resulting in much shorter measurement times; and 3) a calibration of the delay is built in to the measurement circuit.

Although illustrative embodiments have been described herein with reference to the accompanying drawings, it is to be understood that the present disclosure is not limited to those precise embodiments, and that various changes and modifications may be effected therein by one of ordinary skill in the pertinent art without departing from the scope or spirit of the present disclosure. All such changes and modifications are intended to be included within the scope of the present disclosure as set forth in the appended claims.

What is claimed is:

1. An on-chip jitter measurement circuit for receiving a reference clock and at least one signal of interest, the circuit comprising:

a latch for comparing the arrival time of the at least one signal of interest to the reference clock, wherein the latch comprises an edge-triggered latch;

a delay chain in signal communication with the reference clock for varying the arrival time of the reference clock, the delay chain having a first stage, at least one middle stage, and a last stage;

a voltage controller in signal communication with the at least on middle stage of the delay chain for controlling the delay of the arrival time of the reference clock, wherein the voltage controller permits the first and last stages of the delay chain to retain a full voltage swing independent of the delay, and wherein the voltage controller comprises a state machine in signal communication with the ring for controlling the delay of the ring oscillator;

a NAND gate in signal communication with the delay chain for converting the delay chain into a ring oscillator to calibrate the delay;

a ring oscillator counter in signal communication with the ring oscillator for counting pulses of the ring oscillator to establish the calibration;

a reference counter in signal communication with the reference clock for counting pulses of the received reference clock to provide a reference for the established calibration;

a latch counter in signal communication with the latch for counting the instances of the reference clock latching the at least one signal of interest;

a NAND gate in signal communication with the latch for resetting the input to the latch counter after each reference clock;

a clock counter in signal communication with the reference clock for counting the number of reference clocks input to the latch; and a multiplexer in signal communication with the at least one signal of interest for selecting the at least one signal of interest from a plurality of potential signals of interest.

* * * * *